(12) United States Patent
Iwata et al.

(10) Patent No.: US 9,391,224 B2
(45) Date of Patent: Jul. 12, 2016

(54) SOLAR BATTERY

(75) Inventors: Yasushi Iwata, Tsukuba (JP); Kanako Tomita, Yokohama (JP)

(73) Assignee: National Institute of Advanced Industrial Science and Technology, Chiyoda-ku, Tokyo (JP)

( * ) Notice: Subject to any disclaimer, the term of this patent is extended or adjusted under 35 U.S.C. 154(b) by 709 days.

(21) Appl. No.: 13/581,027

(22) PCT Filed: Feb. 25, 2011

(86) PCT No.: PCT/JP2011/001101
§ 371 (c)(1),
(2), (4) Date: Aug. 24, 2012

(87) PCT Pub. No.: WO2011/105102
PCT Pub. Date: Sep. 1, 2011

(65) Prior Publication Data
US 2013/0000727 A1    Jan. 3, 2013

(30) Foreign Application Priority Data

Feb. 25, 2010    (JP) .................................. 2010-039816

(51) Int. Cl.
*H01L 31/0264*    (2006.01)
*H01L 31/18*    (2006.01)
(Continued)

(52) U.S. Cl.
CPC .............. *H01L 31/06* (2013.01); *C23C 14/048* (2013.01); *C23C 14/221* (2013.01);
(Continued)

(58) Field of Classification Search
CPC ................ H01L 31/035209; H01L 31/035218
See application file for complete search history.

(56) References Cited

U.S. PATENT DOCUMENTS

| 2007/0151592 A1* | 7/2007 | Forrest et al. ................. 136/243 |
| 2009/0255580 A1* | 10/2009 | Dasgupta et al. ............. 136/256 |
| 2011/0146774 A1* | 6/2011 | Kim et al. ...................... 136/255 |

FOREIGN PATENT DOCUMENTS

| JP | 2001-158956 | 6/2001 |
| JP | 2004-356163 | 12/2004 |

(Continued)

OTHER PUBLICATIONS

Cao et al, A Facile One-step method to Produce Graphene-CdS Quantum Dot Nanocomposites as Promising Optoelectronic Materials, Sep. 3, 2009, Advanced Materials vol. 22, pp. 103-106.*
(Continued)

*Primary Examiner* — Jennifer Michener
*Assistant Examiner* — Bethany L Martin
(74) *Attorney, Agent, or Firm* — Young Basile Hanlon & MacFarlane, P.C.

(57) ABSTRACT

Disclosed is a solar battery which: is made from a silicon semiconductor; has a high quantum-conversion efficiency; requires a small number of production steps during manufacturing; and is capable of being recycled in view of environmental load and material recycling. Specifically, a solar battery according to an embodiment of the present invention has a basic structure of a P—$Si_N$—N junction in which minute silicon clusters are inserted in a P—N junction, and includes a quantum dot layer having a multiple energy level structure consisting of an energy level of a valence band and an energy level of a conduction band, and intermediate energy levels located between both the bands. The quantum dot layer is composed by periodically arranging silicon quantum dots consisting of silicon clusters with an average particle diameter of 2.5 nm or less and an inter-quantum-dot distance of 1 nm or less.

2 Claims, 6 Drawing Sheets

(51) Int. Cl.

| | | |
|---|---|---|
| H01L 31/06 | (2012.01) | |
| C23C 14/28 | (2006.01) | |
| H01L 31/028 | (2006.01) | |
| H01L 31/0352 | (2006.01) | |
| H01L 31/0392 | (2006.01) | |
| H01L 31/075 | (2012.01) | |
| C23C 14/04 | (2006.01) | |
| C23C 14/22 | (2006.01) | |

(52) U.S. Cl.
CPC .............. *C23C 14/228* (2013.01); *C23C 14/28* (2013.01); *H01L 31/028* (2013.01); *H01L 31/03921* (2013.01); *H01L 31/035218* (2013.01); *H01L 31/075* (2013.01); *H01L 31/18* (2013.01); *H01L 31/1804* (2013.01); *Y02E 10/547* (2013.01); *Y02E 10/548* (2013.01); *Y02P 70/521* (2015.11)

(56) References Cited

FOREIGN PATENT DOCUMENTS

| | | |
|---|---|---|
| JP | 2005-322877 | 11/2005 |
| JP | 2007-162059 | 6/2007 |

OTHER PUBLICATIONS

Yasushi Iwata et al., "Silicon Cluster Material to Form Three-Dimensional Nano Cluster Order: Searching for New Extension in Silicon Functionality," Expected Materials of the Future, vol. 4, No. 10, pp. 38-44 (2004).

Yasushi Iwata et al., "Spatiotemporal Confinement of Cluster Growth: Progress in Nanostructural Cluster Process Technologies," ETL News, vol. 600, pp. 4-9 (2000).

English Translation of International Preliminary Report on Patentability for PCT/JP2011/001101, dated Sep. 18, 2012.

Yasusi Iwata et al, "Spatiotemporal confined cluster", ETL News, 2000.1, pp. 4-9.

International Search Report in PCT/JP2011/001101.

Gavin Conibeer, et al., "Silicon Quantum Dot Nanostructures for Tandem Photovoltaic Cells," Thin Solid Films 516, pp. 6748-6756 (Elsevier B.V. 2008).

Yasushi Iwata, et al., "Narrow Size-Distributed Silicon Cluster Beam Generated Using a Spatiotemporal Confined Cluster Source," Chemical Physics Letters 358, pp. 36-42 (Elsevier Science B.V. 2002).

Yasushi Iwata, et al., "Spontaneous Ordering of Silicon Nanoblocks and Progress in the Deposition System," Laser Processing Academic Journal, vol. 10, No. 3, pp. 57-60 (2003) (Partial English Translation attached is of section 1 on page 57 and ending at the top of page 58).

* cited by examiner

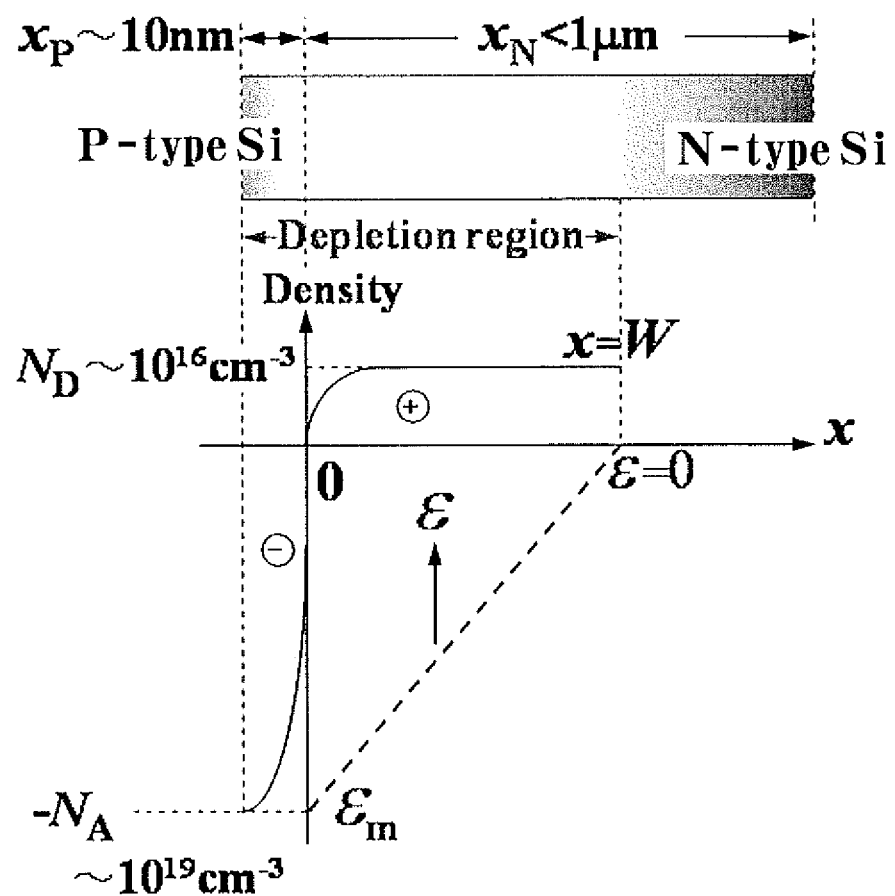
*F I G. 1*

F I G. 8
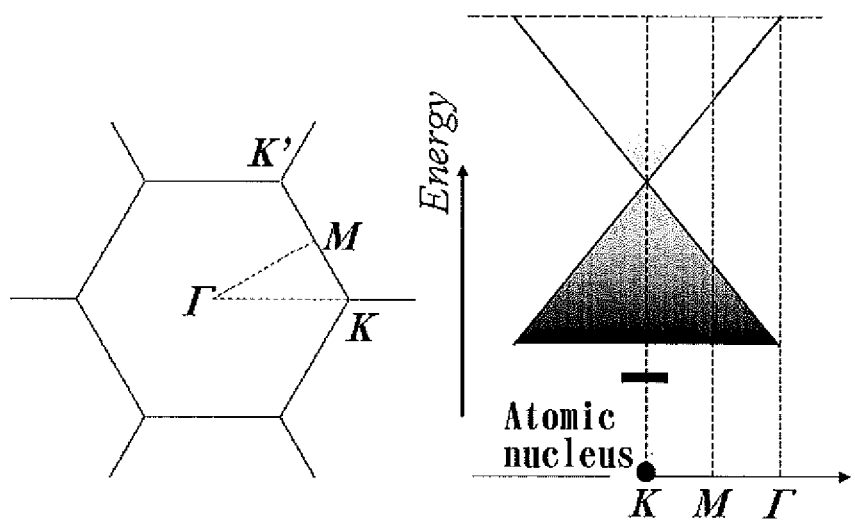

SOLAR BATTERY

TECHNICAL FIELD

The present invention relates to a solar battery using a silicon cluster.

BACKGROUND

Recently, the advent of a practical solar battery excellent in conversion efficiency has been desired. Regarding the conversion efficiency of a P—N junction solar battery, the limiting value under the ideal condition under which the excitation of excitons, which absorbs sun light with a distribution of black-body radiation at a surface temperature of 6000K is balanced with radiation emitted from the deexcitation of excitons obtained as a function of a band gap Vg. The limiting value of the conversion efficiency reaches a maximum value of 31% at Vg=1.3 eV close to the band gap of silicon crystals. The maximum value is considered to be theoretical limit of the conversion efficiency of a silicon solar battery.

The conversion efficiency of the silicon P—N junction solar battery is practically half or less the theoretical limit of the conversion efficiency. Examples of causes of the reduction in conversion efficiency include: the shortened lifetime of carriers at the junction interface between electrodes; and the recombination of carriers in the depletion layer of the P—N junction. The conversion efficiency of the silicon P—N junction solar battery has been improved up to 24% due to the lifetime of carriers being prolonged by passivation of the junction interface between electrodes. Recombination of carriers in the interface is suppressed by inserting, as an intermediate layer of a hetero junction, a layer of amorphous silicon (a-Si:H), which serves as a buffer area, with a large band gap. Thereby, a high open-circuit voltage is obtained and then the conversion efficiency has shown a value exceeding 20%.

Crystalline silicon P—N junction solar batteries based on crystalline silicon substrates have monopolized the market for solar batteries. However, the cost of raw materials has become a greater part of the manufacturing cost as such production has increased. It has been reported that the cost of raw materials made up over 70% of total costs in some cases. A significant reduction in the cost of raw materials for solar batteries comprised of silicon thin films has been attained with no use of a crystalline silicon substrate being needed. Such solar battery, which is flexible and has a large area, is attained by depositing a silicon thin film on a 1 $m^2$ glass substrate, and has been rapidly entering the market in recent years. The introduction of new concept solar cell technologies which can realize an increase in the conversion efficiency to a level so high that it greatly exceeds the theoretical limit of 31% of the silicon P—N junction solar battery is indispensable in the development of photovoltaic technologies aiming to achieve progress in "autonomous" energy supply systems, which lighten the load of electric power supply systems, and, in turn, aiming to expand use of photovoltaic energy supply systems.

Conventionally, a silicon quantum dot solar battery has employed nonocrystalline silicon (nc-Si) that is dispersed in a silicon oxide ($SiO_2$) layer. An nc-Si/$SiO_2$ quantum dot layer is formed by: initially stacking amorphous silicon (a-Si) layers and silicon oxide ($SiO_2$) layers in an alternate manner; and annealing the resultant stack for about one hour at 1050° C. to 1100° C., so as to precipitate silicon in the a-Si layer, which forms nc-Si. Silicon nitride ($Si_3N_4$) or silicon carbide (SiC) may be used, instead of the stacked $SiO_2$ layers (see G. Conibeer et al., "Silicon quantum dot nanostructures for tandem photovoltaic cells", Thin Solid Films, 516 (2008), pp. 6748-6756) (hereinafter Conibeer et al.). In the formed nc-Si/$SiO_2$ quantum dot layer, nc-Si is distributed with a broad particle diameter dispersion ranging from fine particles of 2 nm in diameter to large particles of 5 nm or more in diameter. Furthermore, the particle spacing of nc-Si is not uniform and particles separated by spacing of 5 nm or more can often be found. The same mostly holds true for nc-Si/$Si_3N_4$ and nc-Si/SiC quantum dot layers. The density of the silicon quantum dots is in the order of $10^{10}$ per unit area (1 $cm^2$) and is up to $1 \times 10^{11}$ at most in each layer.

The present inventors have continued the search and development of silicon nanoclusters (see Patent Documents JP 2001-158956 A and JP 2007-162059 A, and Non-Patent Documents Yasusi Iwata et al., "Array order formation of silicon nanoblocks and practical application of thin film deposition system", Laser Processing Academic Journal, 10 (2003) pp 57-60, and Yasusi Iwata et al, "Narrow size-distributed silicon cluster beam generated using a spatiotemporal confined cluster source", Chem. Phys. Lett., 358 (2002) 36-42).

BRIEF SUMMARY

The conventional nc-Si/$SiO_2$ quantum dot layer does not meet the conditions necessary to realize high conversion efficiency of a quantum dot solar battery. Note that a quantum dot is an atomic cluster in which all of the valence electrons are quantized by spatial confinement. When the atomic clusters of semiconductor have a granular shape with a size the same as the de Broglie wavelength (several nm to 20 nm) of the valence electrons, the electrons confined in the atomic cluster form an electronic structure with a wide band gap. It has been desired to find the conditions necessary for the quantum dot layer to function as a solar battery.

The current silicon quantum dot solar battery has been reported as having a conversion efficiency of around 10%, which is far lower than that of a polycrystalline silicon solar battery. Further, a method of stacking a-Si layers and $SiO_2$ layers in alternating fashion with a thickness of several nm for each layer and then annealing the resultant stack at a high temperature for an extended period of time requires steps equal in number to the layers to be stacked, and such method has low productivity. Further, a solar battery obtained by alternately stacking a-Si and $SiO_2$/$Si_3N_4$/SiC still also involves a technical problem in the reuse of the materials involved.

In the present invention, it is necessary to clarify a band structure required for a solar battery (technical problem 1). Further, in the production of silicon cluster solar batteries, materials that place a lower environmental load and are that recyclable have to be used, assuming beforehand the mass use of solar batteries from a practical point of view (technical problem 2). Furthermore, it is essential that a device structure be designed that involves fewer production steps, in order to improve productivity (technical problem 3). Moreover, considering the present technology wherein the cost of silicon materials occupies 70% of expenses, the absorption coefficient with respect to the sunlight spectrum is an important technical issue regarding a technique for producing thinner structures of the silicon cluster solar battery. In response, it is essential for the cluster layer to exhibit a high absorption coefficient with respect to the sunlight spectrum (technical problem 4). An important factor in determining the efficiency of the silicon cluster solar battery is the lifetime of carriers, and accordingly, interface control is required (technical problem 5).

The present invention has been made in light of the aforementioned drawbacks and technical problems of the conventional designs, and an objective of the invention is to provide a silicon cluster solar battery which affords a high electromotive force and a high absorption efficiency to provide high quantum conversion efficiency and which has excellent carrier conductivity.

The present invention has the following features to accomplish the above-identified objective.

Embodiments of the present invention comprise a quantum dot layer having a multiple energy level structure consisting of an energy level of a valence band and an energy level of a conduction band, and intermediate energy levels located between both the bands. The quantum dot layer is composed by periodically arranging silicon quantum dots consisting of silicon clusters with an average particle diameter of 2.5 nm or less a face-to-face distance between the silicon quantum dots of 1 nm or less. The average particle diameter can be found by measuring particle diameters of the clusters in an observation area of the silicon clusters and then taking the statistical average. When the silicon clusters form up a periodic array structure, a statistical average is taken for every area for a certain period (coherent length). By setting the average particle diameter at 2.5 nm or less, the silicon cluster may have, at a surface layer thereof, a cage structure excellent in carrier conductivity and achieve an excellent quantum-conversion efficiency showing an absorption coefficient two (2) orders higher than that of polycrystalline silicon. A silicon cluster layer composed of silicon clusters can thus be made thin. Accordingly, these merits can overcome the technical problems to be solved by the present invention.

Further, when the face-to-face distance between the silicon quantum dots is set at 1 nm or less, an electron wave number spreads over clusters, which allows generated carriers to directly migrate between the clusters, thereby achieving a current density higher than that of a tunnel current. It is preferable for the quantum dot layer to comprise a stack of up to 300 layers of the silicon clusters so as to have a thickness of 1 μm or less. Moreover, when 100 to 300 layers of the silicon clusters are stacked, the stack exhibits a sufficient light absorption function to the sunlight spectrum, and this is preferable as the effect of the present invention becomes conspicuous.

Moreover, in a solar battery of the present invention, the quantum dot layer may be provided, at an interface thereof, with a graphene layer.

The production method of the present invention includes a method of producing a solar battery, the method comprising forming quantum dot layers having a multiple energy level structure consisting of an energy level of a valence band and an energy level of a conduction band, and intermediate energy levels located between both the bands by periodically arranging silicon quantum dots consisting of silicon clusters.

According to an embodiment of the present invention, it is possible to reduce environmental load and to use a large amount of recyclable materials because the present invention provides a P—$Si_N$—N junction solar battery in which microscopically-defined silicon clusters (hereinafter referred to as "μ-$Si_N$ clusters") are inserted into a silicon P—N junction. Further, according to an embodiment of the present invention, the μ-$Si_N$ cluster layer inserted into the P—N junction having a high electromotive force has an effect of providing a quantum conversion efficiency two orders higher than that of the conventional polycrystalline silicon and also has an effect of having excellent carrier conductivity resulting from the cage structure appearing on the surface layer of the μ-$Si_N$ clusters.

Furthermore, the invention attains a high conversion efficiency of over 31%, being the limiting value of the conversion efficiency of the silicon solar battery based on passivation control at the junction interface in the P—$Si_N$—N junction utilizing graphene. Moreover, according to an embodiment of the present invention, it is possible to expect high conversion efficiency over the conventional conversion efficiency while employing a device structure involving a reduced number of production steps, and it is also possible to improve productivity, thereby meeting energy demands in the future.

Additionally, according to an embodiment of the present invention, the high quantum conversion efficiency of the μ-$Si_N$ cluster layer can attain effective quantum conversion, employing a thin layer with a thickness of 1 μm or less as the μ-$Si_N$ cluster layer, and thus, the cost of silicon materials can be sufficiently suppressed.

BRIEF DESCRIPTION OF THE DRAWINGS

FIG. 1 is a view explaining an Abrupt P—N junction;
FIG. 8 is a view showing an energy dispersion relation of graphene used in the second embodiment of the present invention.

DETAILED DESCRIPTION OF EMBODIMENTS

Figure 2:
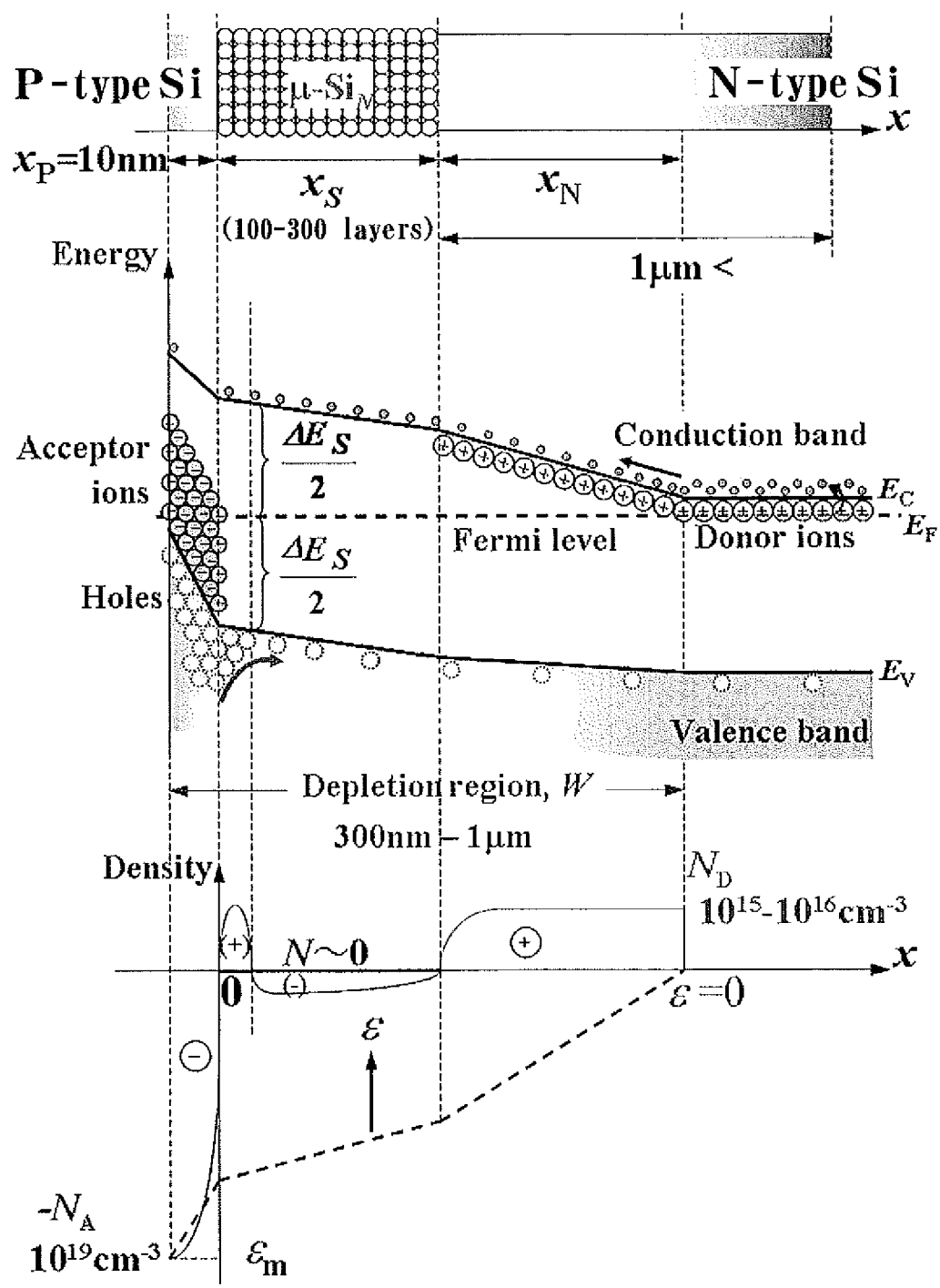
FIG. 2 is a view explaining a P—$Si_N$—N junction using μ-$Si_N$ clusters of the present invention.

Hereinafter, embodiments in which a solar battery of the present invention is embodied will be explained in detail based on principles and examples.

A principle of a quantum dot solar battery to obtain a high efficiency in the present invention will be explained below. In the silicon quantum dot solar battery, in which a quantum dot layer formed by periodically arranging silicon quantum dots in order consisting of silicon clusters is jointed between a P layer and an N layer of a P—N silicon junction, a multiple energy level structure consisting of energy levels of a valence band and energy levels of a conduction band, and energy levels formed between both the bands, is formed in the quantum dot layers. The quantum dot layer takes on an energy level structure in which energy levels of a valence band and energy levels of a conduction band are arranged with a forbidden energy gap therebetween according to a periodic array of constituent atoms in the quantum dots. In addition, discrete energy levels are formed in the band gap due to a periodic array of the quantum dots, which has a longer period than that of the atoms. The newly-formed discrete energy levels are defined by equations (1) and (2), and are referred to as intermediate energy levels as they are located between the energy levels of the valence band and the energy levels of the conduction band. The intermediate energy levels form a multiple energy level structure together with the energy levels of the valence band and the energy levels of the conduction band. A silicon quantum dot layer comprised of a three-dimensional periodic array of silicon clusters is characterized by its arrangement period $d_p$ (p=x, y, z) and by a quantum dot size ($a_x \times a_y \times a_z$) and defines an intermediate energy level Jm. When simply defining a periodic potential formed by the quantum dots using a rectangular periodic potential (Kronig-penny potential) having a height $V_0$ of a barrier, a width $b_p$ (p=x, y, z), and a distance $a_p$ ($d_p = a_p + b_p$), a dispersion relation E (k, $a_p$, $b_p$) of electron energy is expressed by the following equation with m* as the effective mass of an electron and with k as a wave number.

[Equation 1]

$$\cos(\alpha a_p)\cosh(\beta b_p)\frac{\alpha^2 - \beta^2}{2\alpha\beta}\sin(\alpha a_p)\sinh(\beta b_p) = \cos(kd_p) \quad (1)$$

[Equation 2]

$$\alpha = \sqrt{\frac{2m^*E}{\hbar^2}}, \beta = \sqrt{\frac{2m^*(V_0 - E)}{\hbar^2}} \quad (2)$$

The variables α and β represent momentum of an electron the respective cases where an interval between quantum dots is defined by being barrier free (V=0) and is defined by a potential of a constant height $V_0$. Because the right side of equation (1) varies only from −1 to +1, only an area E in which the left side of equation (1) has a value from −1 to +1 is allowed to serve as energy levels of electrons. The allowed energy levels of electrons are discrete, and are defined as intermediate energy levels $J_1, J_2, \ldots, J_m$ in increasing order. According to equations (1) and (2), it is required that stable intermediate energy levels be formed wherein: quantum dots defining the periodic potential of a silicon quantum dot layer are uniformly distributed with monodispersive or plural-dispersive size distributions; and the quantum dots are arranged into a periodic long-distance order such that the coherent area of the periodically arranged quantum dots extends over a wide range of the quantum dot layer.

The value of 31%, considered to be a theoretical limiting value of the conversion efficiency of the silicon solar battery, has been calculated assuming a thermal equilibrium between radiation from sunlight and radiation emitted by deexcitation of excitons in the solar battery, on the basis of the energy level structure only consisting of the energy levels of the valence band and the energy levels of the conduction band. In the silicon quantum dot solar battery, where the multiple energy level structure, including the intermediate energy levels of the quantum dot layer, constitutes an energy level structure optimum to absorb sunlight having a radiation distribution of 6000 k, the theoretical limiting value of its conversion efficiency greatly exceeds the conventional theoretical limiting value. The theoretical limiting value of the conversion efficiency of the silicon quantum dot solar battery increases with the number n of the formed intermediate energy levels. As compared with the theoretical limiting value of 31% of the conversion efficiency for n=1, the theoretical limiting value of the conversion efficiency for n=2 is 43%, the theoretical limiting value of the conversion efficiency for n=3 is 49%, and the theoretical limiting value of the conversion efficiency for n=∞ is 70%. When an optimum condition of the reflection of the solar battery surface is employed, the theoretical limiting value of the conversion efficiency reaches 86.8% at the maximum, resulting in a value close to the limiting value of 95% of the conversion efficiency of a Carnot engine. In order to practically operate a silicon quantum dot solar battery showing a high theoretical limiting value of conversion efficiency that greatly exceeds the conventional theoretical limiting value of conversion efficiency of a silicon solar battery, the three conditions set forth below further need to be met.

A silicon cluster ($\mu$-$Si_N$) has crystal structures having different atomic arrangements at a surface of the cluster and inside the cluster. Whereas the inside of the $\mu$-$Si_N$ cluster forms a diamond structure identical with that of silicon crystal, a cage structure peculiar to the $\mu$-$Si_N$ cluster exists locally at a surface layer thereof. The cage structure includes π electron and forms a $sp^2$ hybrid orbital that, as with graphite, exhibits an electronic structure state excellent in conductivity. Regarding silicon single crystal forming a $sp^3$ hybrid orbital, unpaired electrons appear on the crystal surface. Since the unpaired electrons capture carriers, the carrier lifetime is extremely short on the surface of the silicon single crystal. On the other hand, since no unpaired electron exists of the surface of a silicon cluster, leading to excellent carrier conductivity, the carrier lifetime can be expected to be longer by several orders than that of the carrier lifetime on the surface of the silicon single crystal. According to a reported case on the chemical reactivity of the $\mu$-$Si_N$ cluster, the $\mu$-$Si_N$ cluster has a reaction coefficient smaller by three orders than that of the surface of the silicon single crystal and, as with a graphite surface, is inert to chemical reaction. This supports such long carrier lifetime.

Next, comparing the cage structure with the diamond structure in the $\mu$-$Si_N$ cluster from the perspective of the symmetry and periodicity of the structure, the diamond structure shows that Si atoms are periodically arranged, throughout the structure, with a constant value of the distance between adjacent Si atoms in the cluster. In contrast, the cage structure has no periodicity in the arrangement of Si atoms inside the cluster. In order to form a crystal band structure inside the $\mu$-$Si_N$ cluster that absorbs the visible light region of sunlight having a radiation distribution of 6000 k, as in silicon bulk crystal, the $\mu$-$Si_N$ cluster must have a diamond structure. The ratio of the two kinds of crystal structures in the $\mu$-$Si_N$ cluster varies depending on the cluster size. The cage structure is dominated by $\mu$-$Si_N$ clusters, ranging from an ultra-fine $\mu$-$Si_N$ cluster composed of several Si atoms to a$\mu$-$Si_N$ cluster composed of about 300 Si atoms with a particle diameter of up to 2.2 nm. A larger cluster composed of, e.g., 420 Si atoms with a particle diameter of 2.5 nm, locally contains the cage structure on the cluster surface. On the other hand, the diamond structure appears in a$\mu$-$Si_N$ cluster composed of 190 or more Si atoms with a particle diameter of 2 nm or more. As to an example of actual measurement, there is a report that a $\mu$-$Si_N$ cluster having a spherical structure containing the diamond structure that is composed of about 40 or more Si atoms with a particle diameter of 1 nm or more has been observed. Namely, the cage structure is dominant in a relatively small $\mu$-$Si_N$ cluster, and the transition to the diamond structure appears with an increase in cluster size. The size at which the structural transition occurs is considered to be within the range of 1 nm to 3 nm in terms of particle diameter. From the foregoing, it is concluded that a necessary condition regarding the size of the $\mu$-$Si_N$ cluster in order to have the diamond structure inside thereof and to have the cage structure in the surface layer, in order for the silicon quantum dot layer to function for a practical solar battery, is a particle diameter of at least 1 nm to 3 nm or so, and ideally an average particle diameter of 2 nm to 2.5 nm (condition 1).

In order to expect high carrier conduction of the quantum dot layer as a condition necessary for the silicon quantum dot layer to function as a solar battery, it is desirable that the face-to-face distance between the silicon quantum dots is as close as possible to 1 nm, at which distance an electron is able to be transferred between the silicon quantum dots, while the face-to-face distance between the silicon quantum dots should not be close to a value of equal to or less than 0.25 nm, being the distance between Si atoms in the $sp^2$ hybrid orbital in the cage structure formed in the surface layer of the $\mu$-$Si_N$ cluster (condition 2). As to the $sp^2$ hybrid orbital in the cage structure formed in the surface layer of the $\mu$-$Si_N$ cluster, the wave function also spreads in the radial direction of the cluster. In a state where the distance between adjacent $\mu$-$Si_N$ clusters in the silicon quantum dot layer approaches but does not exceed 1 nm, the wave functions slightly overlap with each other and the spreading of a wave number of electrons over the clusters can be expected. The layer of periodically arranged $\mu$-$Si_N$ clusters can be described in the same manner as that of an atomic model in crystal by creating a picture in which the inner core of a cluster is regarded as a point charge having a positive effective charge. The wave number of $\mu$-$Si_N$ cluster surface electrons is spread along a point charge period having a positive effective charge, and the formation of a new band structure in the $\mu$-$Si_N$ cluster layer can thus be expected. A carrier generated in the $\mu$-$Si_N$ cluster layer migrates in the layer along the band structure. In the present invention, it becomes possible to generate $\mu$-$Si_N$ clusters controlled so as to have an average particle diameter of 2.5 nm or less through the introduction of the silicon cluster technology, which allows a band to be formed due to overlapping of the wave functions of the cluster located close to each other with a distance close to 1 nm or less therebetween. As to a principle of how an electron migrates between quantum dots, this is the first time for a quantum dot solar battery to be able to introduce the band formation due to overlapping of the wave functions.

Further, in order to mitigate carrier capture in the interface of the quantum dot layer, interface control of the quantum dot layer is necessary (condition 3). The present invention attempts to prolong the lifetime of a carrier in the interface of the quantum dot layer by introducing graphene technology represented by graphene in the solar battery interface control for the first time.

In the silicon cluster thin film disclosed in Yasusi Iwata et al., "Array order formation of silicon nanoblocks and practical application of thin film deposition system", Laser Processing Academic Journal, 10 (2003), pp. 57-60 (hereinafter Iwata et al.), which lacks the suggestion of application to a solar battery, the $\mu$-$Si_N$ cluster of 2.3 nm in average particle diameter is formed uniformly with a size dispersion of 5% or less. In the silicon cluster thin film, the silicon clusters form a periodic structure over the area with an array period $d_p$ of 3.1 nm and a coherent length of 100 nm or more. This indicates a possibility that, using the silicon cluster film for the silicon quantum dot layer, intermediate energy levels between the energy level of a valence band and an energy level of the conduction band according to equations (1) and (2). Furthermore, it has been observed that the $\mu$-$Si_N$ clusters in the silicon cluster thin film may be arranged in an order at intervals of 1 nm. This is equal to $1\times10^{13}$/cm$^2$ in the array density of the silicon clusters. Comparing the above with the reported array densities of quantum dots, the highest density among the reported array densities of quantum dots is $1\times10^{11}$/cm$^2$ at the most, and the silicon cluster thin film shows a density two orders higher. This meets condition (1) of defining control of the particle diameter of a silicon quantum dot, and condition (2) of defining the face-to-face distance between the silicon quantum dots, which are both necessary for the silicon quantum dot layer to be able to function as a practical solar battery.

In the quantum dot solar battery described in Iwata et al., in which silicon quantum dots and the $SiO_2$ layers are stacked in alternating fashion, generated carriers migrate, as a tunneling current, through the $SiO_2$ layers as insulating layers. On the contrary, in the silicon quantum dot layer according to this disclosure in which the $\mu$-$Si_N$ clusters are stacked at high density, it is introduced, as a new principle, that generated carriers can directly migrate between the $\mu$-$Si_N$ clusters situated close to one another with a distance of 1 nm or less due to spreading of the wave number of surface layer electrons. When the $\mu$-$Si_N$ cluster layer has a potential gradient, such tendency becomes strong and excellent carrier conductivity, enhancing the efficiency of the solar battery, can be expected in a solar battery utilizing the silicon cluster thin film.

For high efficiency of the P—$Si_N$—N junction solar battery utilizing the $\mu$-$Si_N$ clusters, at first, the design of the band structure is conducted with the aim of effectively collecting carriers generated in the $\mu$-$Si_N$ cluster layer.

In order to increase the mobility of the generated carriers, a P—N junction (an abrupt P—N junction) is considered in which: a high electromotive force (built-in potential) is generated in the P—N junction that sandwiches the $\mu$-$Si_N$ cluster layer therebetween; and the electromotive force generates a steep electric field gradient in the $\mu$-$Si_N$ cluster layer. FIG. 1 is a view explaining the abrupt P—N junction. The upper section of FIG. 1 shows the structure of the P—N junction and the thickness of each layer. The lower section of FIG. 1 shows the individual carrier density corresponding to the structure. In a depletion layer formed at the interface of the abrupt P—N junction, the negative electric charge of a P layer acceptor and the positive electric charge of an N layer donor are balanced to form a space charge layer, thereby generating an electric field gradient in the depletion layer or region. It is desirable for the thickness of the space charge layer to be set to the same level as, or to be thicker than the thickness of the $\mu$-$Si_N$ cluster layer to be introduced. Under such a setting, the $\mu$-$Si_N$ cluster layer is always in the space charge layer. The carriers generated therein thus always drift, being sensitive to the electric field gradient at the same time of their generation, and are effectively collected.

In the P—$Si_N$—N junction, it is important how the built-in potential can be set in the P—N junction and also how to set the thickness of the space charge layer that appears in the depletion layer. They are defined by an acceptor density $N_A$ and thickness $X_A$ of the P layer, and a donor density $N_D$ and thickness $X_D$ of the N layer. The built-in potential $V_b$, the thickness W of the space charge layer, and the electric field gradient in the space charge layer will be explained below, and the band structure necessary for the P—$Si_N$—N junction (technical problem 1) will be clarified.

In the depletion layer of the abrupt P—N junction, which is in a thermal equilibrium state, the negative electric charge of the acceptor to be injected at high density $N_A$ into the P layer having a very thin thickness of $x_P$=10 nm or less is balanced at the depletion layer with the positive electric charge of the donor existing at density $N_D$ in the N layer with thickness $x_N$ so as to form a space charge layer. Here, equation (3) is established.

$$N_A x_P = N_D x_N \quad \text{[Equation 3]}$$

A steep charge density of the P layer causes a high electric field $\in(x)$ to be generated in the space charge layer having a thickness W ($=x_P+x_N$). The electric field gradient, enables the built-in potential to be made high, the height $V_b$ being the difference in level between the respective conduction band edges $E_{CP}$ and $E_{CN}$ of the P layer and the N layer. Practically, the built-in potential at room temperature (T=300 k) with the acceptor injection density $N_A$ of $1\times10^{19}$ cm$^{-3}$ in the P layer and the donor injection density $N_D$ of $1\times10^{16}$ cm$^{-3}$ in the N layer is given through equations (4), (5) and (6) below, supposing that the excitation carrier density of intrinsic silicon at room temperature is $n_i$, the elementary charge of the carrier is q, the dielectric constant is e, and the Boltzmann constant is $k_B$, together with the thickness of the space charge layer W and the maximum electric field to be applied to the depletion layer $\in_m$.

[Equation 4]

$$V_b = \frac{k_B T}{q} \ln\left(\frac{N_A N_D}{n_i^2}\right) = 0.0259(V) \times \ln\left(\frac{1\times10^{19}\times10^{16}}{(9.65\times10^9)^2}\right) = 0.896(V). \quad (4)$$

[Equation 5]

$$W = \sqrt{\frac{2eV_b}{qN_D}} = \sqrt{\frac{2\times11.9\times8.85\times10^{14}(F./cm)\times0.896(V)}{1.602\times10^{-19}(C.)\times1\times10^{16}(cm^{-3})}} = 3.43\times10^{-5}(cm). \quad (5)$$

[Equation 6]

$$\varepsilon_m = \frac{qN_D W}{e} = \frac{1.602\times10^{-19}(C.)\times1\times10^{16}(cm^{-3})\times3.43\times10^{-5}(cm)}{11.9\times8.85\times10^{-14}(F./cm)} = 5.21\times10^4 (V/cm). \quad (6)$$

According to equation (5), when the donor density $N_D$ of the N layer has a value ranging from $1\times10^{16}$ cm$^{-3}$ to $1\times10^{15}$ cm$^{-3}$, the thickness W of the space charge layer of the P—N junction changes from 343 nm to 1085 nm. Comparing the thickness W of the space charge layer with the thickness $x_s$ of the μ-Si$_N$ cluster layer, and assuming that the inter-cluster distance is 3 nm, the maximum number of stacked layers comprised the μ-Si$_N$ cluster layer that satisfies the condition of $x_s \leq W$ is from 110 layers to 360 layers. As the donor density of the N layer decreases, the built-in potential $V_b$ between the P—N junction also decreases following equation (4), but the difference is small. Potential $V_b$ is decreased by only 6.7% due to the difference in Nb is between $1\times10^{15}$ cm$^{-3}$ and $1\times10^{16}$ cm$^{-3}$. Rather, considering the balance of the space charge, it is desirable that the P layer should be thinner and have high carrier density according to equation (3).

Herein, the P—Si$_N$—N junction utilizing the μ-Si$_N$ cluster layer made from an intrinsic silicon material will be considered. FIG. 2 is a view explaining the P—Si$_N$—N junction utilizing the μ-Si$_N$ cluster layer. The upper section of FIG. 2 shows the structure of the P—Si$_N$—N junction and the thickness of each layer and, corresponding to the above structure, the intermediate section of FIG. 2 shows the energy structure, and the lower section of FIG. 2 shows the carrier density. Corresponding to setting the acceptor density of the P layer $N_A$ to $1\times10^{19}$ cm$^{-3}$ and the donor density of the N layer $N_D$ to $1\times10^{15}$ cm$^{-3}$ to $1\times10^{16}$ cm$^{-3}$, the μ-Si$_N$ cluster layer comprises a stack of 100 to 300 layers. In the μ-Si$_N$ cluster layer, carrier electrons of $n_i=1\times\times10$ cm$^{-3}$ in a thermal equilibrium state at room temperature are excited from the valence band to the conduction band. In the N layer, since roughly 100% of the donor is ionized at room temperature, carrier electrons having the density $N_D$ exist in the conduction band. A concentration difference occurs between the μ-Si$_N$ cluster layer and the N layer, and thus the carrier electrons of the N layer migrate to the conduction band of the μ-Si$_N$ cluster layer. As the carrier density of the N layer is sufficiently higher than the carrier density of the μ-Si$_N$ cluster layer ($n_i \ll N_D$), carrier electrons having an average density of $N_D x_N/(x_S+x_N)$ migrate from the depletion layer of the N layer to the μ-Si$_N$ cluster layer. In the depletion layer of the N layer, the donor positive electric charge with an average density of $N_D x_N/(x_S+x_N)$ having a volume corresponding to the volume of the negative electric charge loss appears. Meanwhile, the extremely thin P layer is, in its entirety, contained in the space charge layer of the depletion layer, and roughly 100% of the acceptor at high concentration is ionized at room temperature. Carrier holes at the density $N_A$ exist in the valence band. Due to the concentration difference between the μ-Si$_N$ cluster layer and the P layer, the carrier holes in the P layer move to the valence band of the μ-Si$_N$ cluster layer. An acceptor negative electric charge with an average density of $N_A x_P/(x_S+x_P)$ having a volume corresponding to the volume of the positive electric charge loss is similarly generated in the depletion layer of the P layer. Under conditional equation (7) in which both the volume losses are equal, the carriers that have moved respectively from the N layer and the P layer are balanced in the μ-Si$_N$ cluster layer, and the space charge density reaches near 0 on average.

[Equation 7]

$$N_D \frac{x_N}{x_S + x_N} = N_A \frac{x_P}{x_S + x_P} \approx N_A \frac{x_P}{x_S}, (x_P \ll x_S) \quad (7)$$

Locally, although many carrier holes (positive electric charge) are unevenly distributed in the P layer having a negative electric charge and many carrier electrons (negative electric charge) are unevenly distributed in the N layer, the space charge density is 0 (N=0) at the interface of both the electric charge distributions. The Fermi level at the interface is positioned just at the center of the band gap energy of the μ-Si$_N$ cluster layer ($E_F = \Delta Es/2$). No carrier transfer occurs in the P—Si$_N$—N junction in a thermal equilibrium state, and therefore the Fermi levels in the P layer, the μ-Si$_N$ cluster layer, and the N layer coincide with one another. However, since the actual μ-Si$_N$ cluster layer contains impurities, carriers having a density far exceeding $n_i$ already exist in the μ-Si$_N$ cluster layer before the transfer of carriers from the N layer and the P layer. When the impurities comprise the donor, carrier electrons migrate to the P layer, and a positive electric charge exists in advance at room temperature in the μ-Si$_N$ cluster layer. As a result of a shift of the Fermi level in the direction of a conduction band edge, a valence band edge $E_{VS}$ of the μ-Si$_N$ cluster layer having a wide band gap is located below a valence band edge $E_{VN}$ of the N layer, which limits the migration of carrier holes. When the impurities comprise the acceptor, carrier holes migrate to the N layer, and the μ-Si$_N$ cluster layer has a negative electric charge at room temperature. As a result of a shift of the Fermi level in the direction of a valence band edge, a conduction band edge $E_{CQ}$ of the μ-$Si_N$ cluster layer is located above a conduction band edge $E_{CP}$ of the P layer, which limits the migration of carrier electrons.

As a result of the above consideration, it can be concluded that it is desirable for the μ-$Si_N$ clusters in the P—$Si_N$—N junction to be fabricated using a high purity silicon material being similar to an intrinsic semiconductor, namely a silicon materials that is manufactured by a method capable of controlling the concentration of impurities that can server a donor or acceptor to at least 1 ppb or less, ideally 0.1 ppb or less, thereby forming a high purity μ-$Si_N$ cluster layer.

Figure 3:
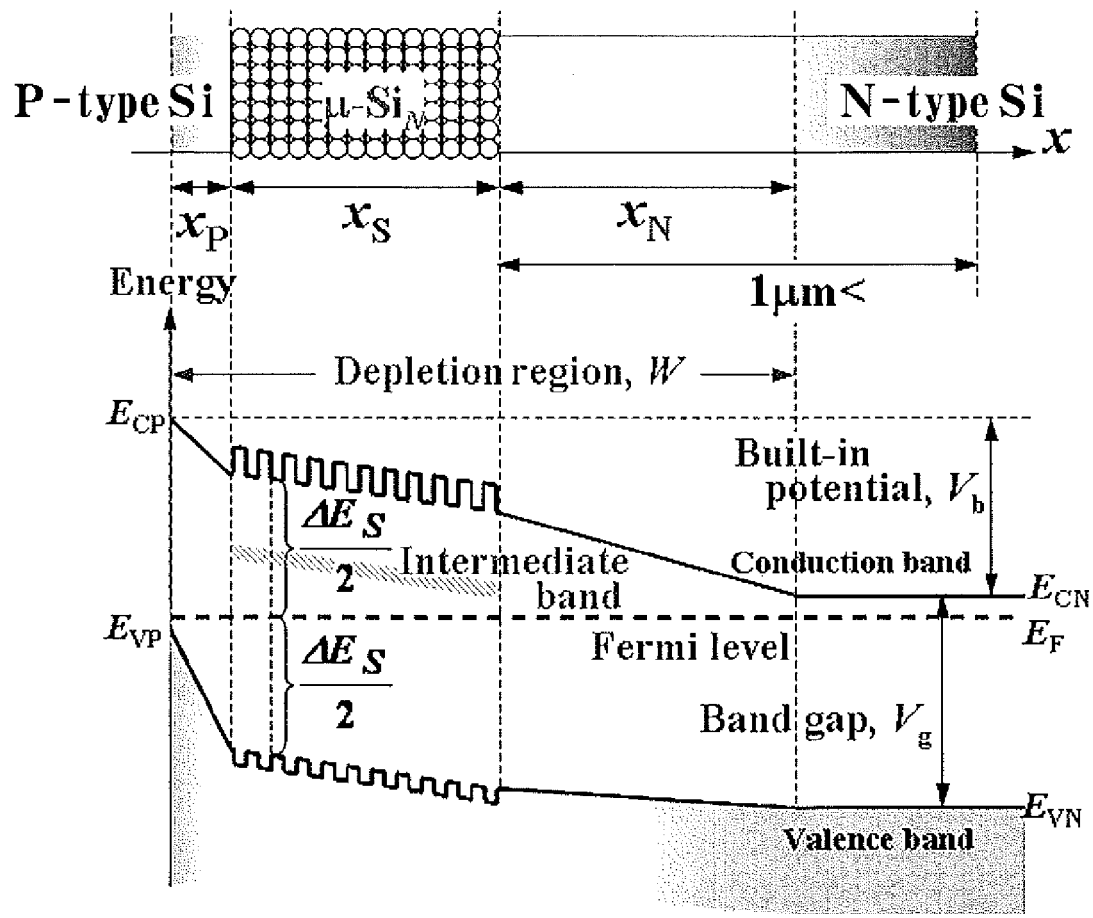
FIG. 3 is a view showing a band structure in the P—$Si_N$—N junction of the present invention.

Consideration is made here as to the band structure in the P—$Si_N$—N junction including 100 to 300 stacking layers of the μ-$Si_N$ clusters, the ingredient of which is high purity silicon similar to an intrinsic semiconductor. FIG. 3 shows the band structure in the P—$Si_N$—N junction of the present embodiment. The upper section of FIG. 3 shows the structure of the P—$Si_N$—N junction and the thickness of each layer. Corresponding to the above structure, the lower section of FIG. 3 shows the energy structure. In the μ-$Si_N$ cluster layer existing in the depletion layer of the P—N junction, carrier electrons and carrier holes move thereto from the N layer and the P layer respectively. Under the condition where equation (7) is satisfied, the average space charge is 0 in the μ-$Si_N$ cluster layer, and the Fermi level is located just at the center of the band gap in the μ-$Si_N$ cluster layer. No carrier transfer occurs under the thermal equilibrium condition, and each Fermi level in the P layer, the μ-$Si_N$ cluster layer, and the N layer in the P—$Si_N$—N junction coincide with one another. The built-in potential $V_b$ is determined by a potential difference between the negative potential of the P layer and the positive potential of the N layer, while these layers locate therebetween the electrically neutral μ-$Si_N$ cluster layer. The setting of the Fermi level of the μ-$Si_N$ cluster layer to be located just at the center of the band gap enables the built-in potential $V_b$ to take a maximum value, resultantly the P—$Si_N$—N junction to have a large open circuit voltage.

Describing the μ-$Si_N$ cluster array periodically arranged in the μ-$Si_N$ cluster stacking layers with a rectangular periodic potential (Kronig-Penny potential), the energy dispersion relation of electrons E (k, $a_P$, $b_P$) given by equations (1) and (2) permit discrete energy levels of the electrons that constitute the intermediate energy levels. The absorption edge defined by the energy level of the valence band and the intermediate energy level has a longer wavelength as compared with the absorption edge of silicon (wavelength λm=1.1 μm) defined by the band gap $V_g$. Resultantly, the quantum efficiency in the long wavelength range is enhanced.

A silicon cluster solar battery device according to the present invention will be explained with initial reference to a first embodiment. The first embodiment describes a design guideline necessary for fabricating a practical solar battery utilizing μ-$Si_N$ silicon clusters made to have a particle diameter of 2 nm to 2.5 nm, using the silicon cluster technology introduced in the present invention. The first embodiment solves technical problems 2 and 3 described above.

Figure 4:
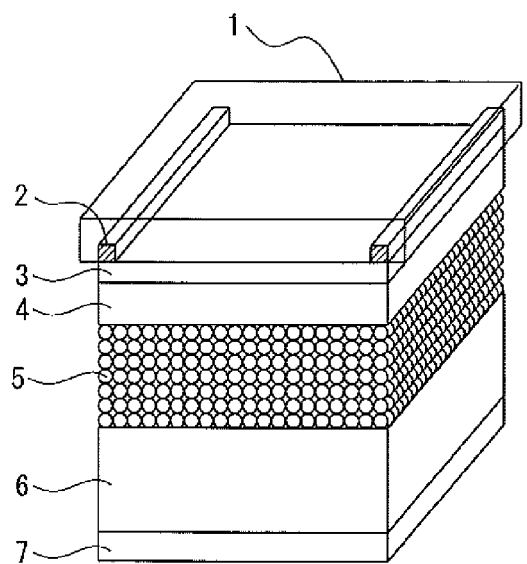
FIG. 4 is a view showing a device structure of a silicon cluster solar battery according to a first embodiment of the present invention.

The first embodiment relates to an all silicon P—$Si_N$—N junction where silicon μ-$Si_N$ clusters are inserted into the simplest P—N junction, and shows a basic solar battery structure of the present invention. FIG. 4 shows a device structure of the silicon cluster solar battery. The first embodiment will be described referring to FIG. 4. As shown in FIG. 4, the device according to the first embodiment comprises a glass substrate 1; a lead-out electrode 2; a transparent electrode 3; P-type microcrystalline silicon 4; quantum dots 5 consisting of silicon clusters (μ-$Si_N$); N-type amorphous silicon or N-type microcrystalline silicon 6; and an electrode 7. The device structure according to the first embodiment is manufactured by firstly embedding the Ag lead-out electrode 2 in the glass substrate 1 so as to expose the surface of the lead-out electrode 2, and by secondly depositing thereon the transparent electrode 3, made of ITO, etc. The P-type microcrystalline silicon (p-Si) 4, the quantum dots 5 consisting of silicon clusters (μ-$Si_N$) having a particle diameter of 2 nm to 2.5 nm, the N-type amorphous silicon (a-Si) or N-type microcrystalline silicon (p-Si) 6 are then stacked thereon, and finally the Al back electrode 7 is deposited thereon. Note that (p-Si) is used as an abbreviation for microcrystalline silicon.

The present P—$Si_N$—N junction-based device structure is characterized by utilizing a silicon cluster (μ-$Si_N$) thin film possessing a uniform particle diameter from 2 nm to 2.5 nm in the quantum dot layer. The μ-$Si_N$ thin film is formed using the cluster beam deposition (see JP 2001-158956 A) to deposit μ-$Si_N$ clusters possessing a uniform size on the substrate. The μ-$Si_N$ clusters are generated by laser ablation in a spatiotemporal confinement type cluster source. Cluster growth can be controlled in a short time by confining a shock wave induced in gas so that silicon μ-$Si_N$ clusters are produced in the cluster source having a small size dispersion (less than 5%) and has a particle diameter of 2.5 nm or less. The μ-$Si_N$ clusters produced under a highly compressed condition by the shock wave in the cluster source vacuum form a beam with an incident energy higher than 1 eV per Si atom. As the deposition of the silicon μ-$Si_N$ clusters is in progress with a higher density on the substrate, the adjacent silicon μ-$Si_N$ clusters come closer to each other. Resultantly, interaction between the silicon μ-$Si_N$ clusters increases, and ordering of the silicon μ-$Si_N$ clusters extends to a wide range area to form a more symmetric array order structure of the silicon μ-$Si_N$ clusters on the substrate. According to observation using a High-Angle Annular Dark Field (HAADF) method of a Transmission Electron Microscope (TEM), the density at full coverage of a monolayer of the silicon μ-$Si_N$ clusters on the substrate (coverage factor=1) is $1 \times 10^{13}/cm^2$. When the deposition density of the μ-$Si_N$ clusters is $2 \times 10^{12}/cm^2$ (coverage factor=0.2), 78.3% of the observed μ-$Si_N$ clusters form pairs, which each consist of two μ-$Si_N$ clusters separated by a short distance. When the deposition density is further increased to reach $6.5 \times 10^{12}/cm^2$ (coverage factor=0.65), plural neighboring μ-$Si_N$ clusters nearby gather to form a close-packed structure consisting of regular hexagons arranged to occupy the apexes of equilateral triangles, whereby an ordering of μ-$Si_N$ cluster array is formed locally. At the full-coverage of a monolayer of the μ-$Si_N$ clusters (coverage factor=1), μ-$Si_N$ clusters of 2.3 nm in average diameter are arranged to be close to one another with an average inter-nuclear distance of 3.1 nm, whereby μ-$Si_N$ cluster arrays are formed over an area of 100 nm×100 nm to order in a tetragonal structure with a high degree of symmetry.

The number of Si atoms comprising the μ-$Si_N$ cluster with a particle diameter of 2.5 nm is about 400. A cage structure peculiar to the μ-$Si_N$ cluster, where one cluster is formed by piling up micro cages, each of which is composed of 6 to 11 Si atoms, appears on the surface layer. The cage structure containing π electrons has a distance of 2.5 Å between the nearest neighbor silicon atoms while the lattice constant for the case of crystalline silicon is 2.36 Å. The cage structure forms a $sp^2$ hybrid orbital that can be seen in graphite, thereby being characterized in having an electronic structure excellent in conductivity. On the other hand, inside the μ-$Si_N$ cluster, σ electrons are dominant and therefore a $sp^3$ hybrid orbital is formed. An electron confined in a nanospace forms a quantum level in accordance with quantum mechanics. The energy gap width of the μ-$Si_N$ cluster increases as the size of the μ-$Si_N$ cluster decreases. The energy gap width of the μ-$Si_N$ cluster of 2 nm to 2.5 nm in particle diameter exceeds 2 eV, compared with the energy gap width of 1.17 eV of a silicon single crystal having a diamond structure.

The μ-$Si_N$ cluster thin film used in the P—$Si_N$—N junction quantum dot solar battery according to the first embodiment of the present invention shows a superior characteristic almost satisfying the conditions necessary for the silicon quantum dot layer to function as a solar battery, which are the problems to be solved by the present invention. The P—$Si_N$—N junction-based device structure comprising the μ-$Si_N$ cluster thin film forms the basis of the silicon cluster solar battery of the present invention.

A manufacturing method of a silicon cluster solar battery will be described below in detail. The method includes the steps of: forming an electrode on a transparent substrate (step 1); forming an ITO transparent electrode (step 2); forming P-type microcrystalline silicon (step 3); forming silicon cluster (step 4); depositing N-type microcrystalline silicon (step 5); and forming a back Al earthed electrode (step 6).

As a glass substrate, ultra-precision machined high-grade glass (BDA/ABC, Nippon Electric Glass Co., Ltd.) is used. In the glass substrate, dust emission from the end face is prevented and the surface is finished to have high cleanness by ultra-precision polishing. The glass substrate uses an ultra-thin plate manufactured using the over flow method (thickness 0.5 mm), which has mechanical properties such as high transparency, thermally high dimensional stability, high hardness, and flexibility, and also has high chemical resistance. The mechanical, chemical, and optical properties of the glass substrate are shown in TABLE 1.

[TABLE 1]

| Density | ×10^3 Kg/m^3 | 2.46 |
|---|---|---|
| Young's modulus | GPa | 73 |
| Poisson's ratio | | 0.2 |
| Vicker's hardness | | 600 |
| Chemical resistance | 10% HCl(80° C.-60 min) | no surface alternation |
| | 63DHF(20° C.-60 min) | no surface alternation |
| Content percentage of alkali | wt % | below 0.1% |
| Content percentage of As and Sb | wt % | not contained |
| Moisture vapor transmission ratio | g/m^2 day | less than $10^{-5}$ |
| Optical transmittance | λ = 550 nm | 92% |
| Refractive index | λ = 587.6 nm | 1.52 |

The Ag lead-out electrode is embedded in the surface of the glass plate so as to expose the electrode surface, and the resultant substrate is then set into a vacuum chamber of an RF sputtering vapor deposition system (step 1). In the RF sputtering vapor deposition system, the steps of: forming an ITO transparent electrode (step 2); forming P-type microcrystalline silicon (step 3); and depositing N-type microcrystalline silicon (step 5) are performed.

The RF sputtering vapor deposition system is a device for depositing a high purity semiconductor thin film under a clean environment of an ultra-high vacuum, and for RF sputtering a target sample of a required base material for depositing the target sample, under the clean environment, on the substrate having a clear surface with a controlled substrate temperature. Two systems have been fabricated respectively for film deposition of the ITO transparent electrode and for film deposition of the P-type and N-type polycrystalline silicon. In both the systems, the target base sample is horizontally mounted upwardly on an RF electrode plate, and Ar is introduced under pressure of 1 Pa to 10 Pa. The deposition substrate is horizontally mounted downwardly facing the target base sample, and an RF of 13.56 MHz is applied to the RF electrode plate at a maximum power of 300 W. During the film deposition of the ITO transparent electrode, $O_2$ is introduced under pressure of $10^{-2}$ Pa to $10^{-3}$ Pa together with Ar so as to control a characteristic of electrode materials. During the film deposition of the polycrystalline silicon, Ar+$H_2$ are introduced. In both the systems, when defining the collision energy of an ion generated by the RF spattering, which collides with the substrate, the RF output voltage is controlled for film deposition. On the other hand, when defining a stacking rate, the RF output voltage is controlled for film deposition. Regarding the deposition surface of the substrate, a clean surface is formed by RF sputtering and by heat annealing before deposition. The substrate temperature during deposition is controlled to be a temperature around 200° C. in the case of the polycrystalline silicon, and to constant temperature of 500° C. at the maximum in the case of the ITO transparent electrode.

A vacuum container ensures a large-diameter film deposition space with an inside diameter of 300 mm or more to realize thin film deposition under a clean environment, and achieves ultra-high vacuum specifications below 5×$10^{-8}$ Pa, by the mounting of a water-cooled turbo pump having an ultimate vacuum of 1×$10^{-5}$ Pa and a pumping speed of 800 L/s, and a dry pump. In the manufacture of the solar battery, the device is manufactured consistently under an ultra-high vacuum, to prevent impurities, including water, from being mingled on the junction interface of the device structure (FIG. 4). The RF sputtering vapor deposition system and the cluster beam deposition system are provided with a load lock function to enable the deposition substrate to be conveyed, in a vacuum, between both of the systems.

Figure 5:
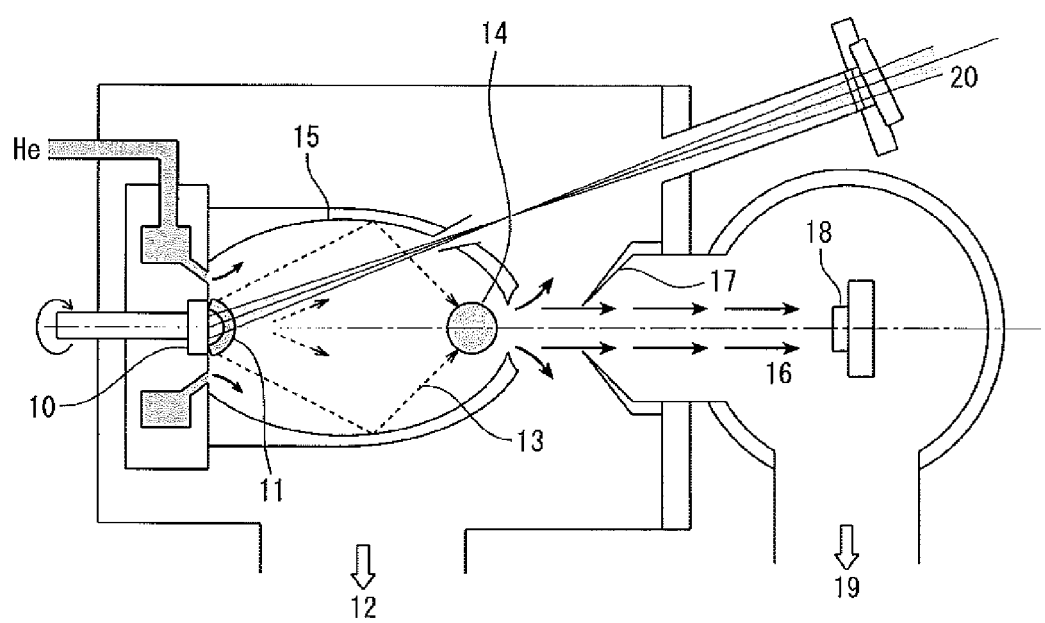
FIG. 5 is a view showing a silicon cluster beam depositing system used for manufacture of the present invention.

The step (step 4) of fabricating silicon clusters will be explained below. A μ-$Si_N$ cluster layer is formed by stacking μ-$Si_N$ clusters in the cluster beam deposition system. FIG. 5 shows a silicon cluster beam deposition system. The cluster beam deposition system is a system, equipped with a laser ablation spatiotemporal confined cluster source, for forming a μ-$Si_N$ cluster thin film by using a μ-$Si_N$ cluster beam generated by controlling its size (see JP 2007-162059 A). In FIG. 5, reference numerals 12 and 19 denote evacuation. An Si target sample 10 is set at an ellipsoidal focus of a cluster generation cell (ellipsoidal cell 15) having an ellipsoidal inner wall, and an Nd-YAG laser beam 20, having a wavelength of 532 nm, energy of 800 mJ, and pulse widths of 11 ns to 13 ns, is radiated to the target sample, while introducing helium thereinto at a given constant pressure of 1 Pa to 10 Pa. A shock wave (reflected shock wave 13) propagating through helium is reflected on onto the cell inner wall by an Si plume (ablation of the sample) 11 generated at the focus of the ellipsoidal cell 15 to confine Si vapor in the helium for 100 μs to 300 μs, and μ-$Si_N$ clusters are formed in a localized boundary area where the helium and the Si vapor are mixed. Such cluster formation area is indicated schematically by a shaped circular portion 14. When the cluster growth occurs, only in a certain local area where the helium and the Si vapor are in a thermal equilibrium state, micro μ-$Si_N$ clusters with a uniform size of 1 nm to 2.5 nm in particle diameter are produced. A part of the produced μ-$Si_N$ clusters contain a few electric charge components while over 90% of the produced μ-$Si_N$ clusters are neutral.

The μ-Si$_N$ clusters are extracted into a vacuum through a skimmer 17 together with a helium flow from an outlet opened in the cell 15 and facing the target sample 10 to form a μ-Si$_N$ cluster beam 16. The neutral μ-Si$_N$ cluster beam 16 travels in the vacuum with a high kinetic energy higher than 1 eV per Si atom and is finally deposited on a substrate 18 set in the vacuum container lying adjacent to the cluster source. When the cluster beam 16 collides with the substrate 18, the kinetic energy higher than 1 eV is converted into internal energy of the μ-SiN clusters, the internal energy of which enables the μ-Si$_N$ clusters to cause rearrangement to form the periodic array structure in the μ-Si$_N$ cluster layer. As shown in FIG. 5, the silicon cluster layer according to the present invention is produced by setting silicon in a cell provided with a laminar flow of inert (helium) gas, and by generating silicon clusters in a mixed gas domain of silicon vapor and the inert gas formed at the interface of the evaporated silicon vapor in contacting with the laminar helium flow, and by extracting the generated silicon clusters along with the laminar helium flow out of the cell into vacuum, and introducing the generated silicon clusters onto the substrate surface, wherein the mixed gas domain is confined and compressed in a localized space by collision with a shock wave induced by laser ablation in the laminar helium flow, and the velocity of the transportation of silicon clusters onto the substrate surface along with the laminar helium flow is accelerated by the mixed gas domain up to at least four times or much higher than the velocity of free-expansion of helium into vacuum, but maximum lower than the velocity in terms of the kinetic energy of the constituent silicon atoms equivalent in amount to the binding energy of the silicon clusters. The collision energy of the single μ-SiN cluster on the substrate surface is high enough to enable the μ-SiN clusters to cause rearrangement to form the periodic array structure in the μ-SiN cluster layer, but not so high as to cause dissociation of the μ-SiN clusters.

Highly-pure silicon single crystal having resistivity ≥1000 Ωc is used as a target sample to produce the μ-Si$_N$ clusters. In place of the FZ method (floating zone melting method) generally used for a highly-pure silicon single crystal, the highly-pure silicon single crystal is produced by the FZ method using a single crystal silicon produced by the CZ method (Czochralski method) (CZ+FZ method). The cost is reduced to approximately ⅕ compared with the general FZ method in which high purity silicon single crystal is fabricated using columnar polycrystalline silicon as a raw material. The silicon single crystal fabricated by the CZ+FZ method is a P-type silicon which shows properties of resistivity ≥1000 Ωcm and lifetime longer than 200 μs. The fabricated high purity silicon single crystal is shaped into a form fit for setting to a target sample holder in the cluster source.

A μ-Si$_N$ cluster thin film is formed (step 4); N-type microcrystalline silicon (p-Si) is deposited (step 5); and the back Al electrode is finally deposited (step 6).

It is important to use a highly-pure silicon material similar to an intrinsic silicon in producing the μ-Si$_N$ clusters of the P—SiN—N junction, a silicon material produced by a method capable of controlling the concentration of the impurities that can serve as a donor or acceptor at 1 ppb or less, or ideally at 0.1 ppb or less. It can be concluded that the μ-Si$_N$ cluster layer in the P—Si$_N$—N junction acts most effectively when the number of stacked layers of the μ-Si$_N$ clusters is set at almost the same thickness as the depletion layer in the P—Si$_N$—N junction or, at the maximum, is set at twice the thickness of the N-layer depletion layer. Accordingly, the thickness of the μ-Si$_N$ cluster layer of 100 to 300 stacked layers of μ-Si$_N$ clusters possessing 2 nm to 2.5 nm in particle diameter and 3 nm in inter-layer spacing.

An important factor for determining the efficiency of the silicon cluster solar battery is quantum-conversion efficiency. In order to attain a conversion efficiency exceeding the theoretical limiting efficiency 31% of the conversion efficiency of a solar battery that utilizes single crystal silicon as a material, a μ-Si$_N$ cluster layer is required to have a high conversion efficiency exceeding the quantum-conversion efficiency of single crystal silicon. As stated above, the μ-Si$_N$ cluster layer most effectively operates when stacking 100 to 300 layers, which takes the form of a thin film solar battery. That is, in order to increase the efficiency of the silicon cluster solar battery, as is pointed out in technical problem 4 above, the μ-Si$_N$ cluster layer is required to exhibit a high absorption coefficient to the sunlight spectrum.

Figure 6:
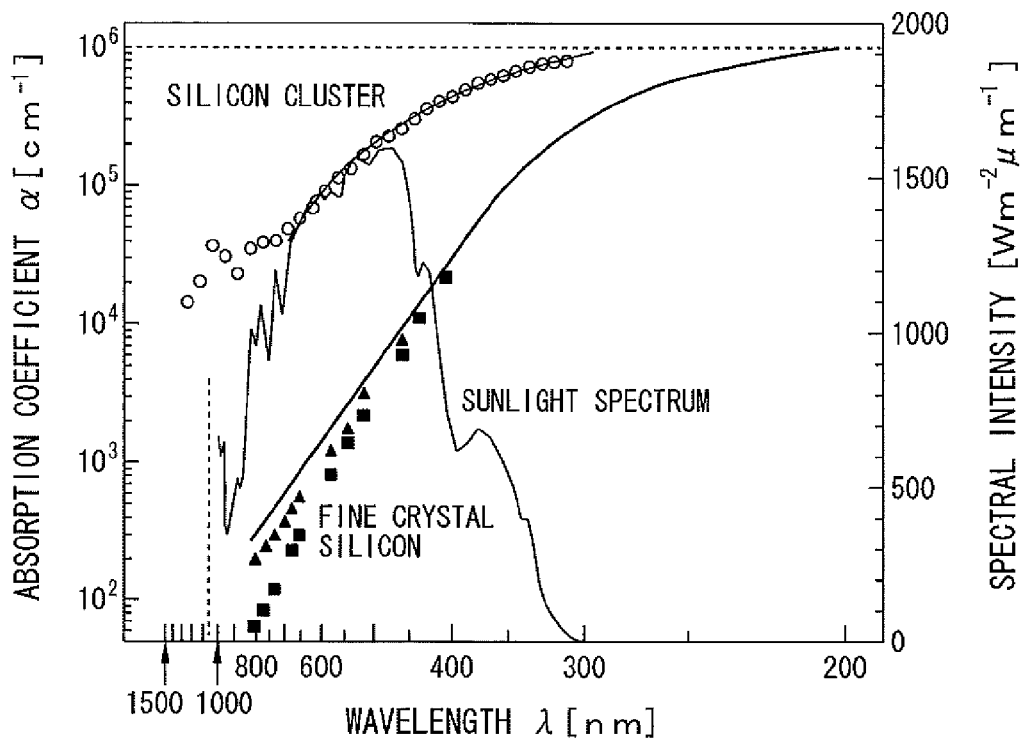
FIG. 6 is a view showing an absorption coefficient of a silicon cluster thin film (reduced value based on a Tauc plot) of the present invention.

It is known that the light absorptivity to the sunlight spectrum of a silicon cluster thin film having a particle diameter of 2 nm to 3 nm is two orders higher than that of a microcrystalline silicon. According to light absorption data by Université Claude Bernard Lyon, 1998, a light absorption coefficient $\alpha_0$ of a silicon cluster thin film having a particle diameter of 2 nm to 3 nm is $\alpha_0=2\times10^4$ cm$^{-1}$ in a wavelength region of around 1000 nm, which is two orders higher than that of microcrystalline silicon, $\alpha_0=1\times10^2$ cm$^{-1}$. FIG. 6 shows the light absorption data by Université Claude Bernard Lyon (reduced value based on Tauc plot) and the absorption coefficient of the microcrystalline silicon. FIG. 6 also shows the intensity of the sunlight spectrum on the ground. According to FIG. 6, the absorption coefficient of the silicon cluster thin film is two orders higher than that of the microcrystalline silicon. Namely, in order to absorb 90% or more of light having a wavelength of 1000 nm, whereas the microcrystalline silicon needs to have a thickness of 230 μm, the silicon cluster thin film having a particle diameter of 2 nm to 3 nm needs to have a thickness of 1.2 μm. Around a wavelength of 600 nm, the light absorption coefficient of the silicon cluster thin film is $\alpha_0=1\times10^5$ cm$^{-1}$ and the thickness necessary to absorb 90% of the light is 230 nm, which is a thickness corresponding to 70 silicon cluster layers in the case of the silicon cluster thin film having a particle diameter of 2 nm to 3 nm. Based on the result of FIG. 6, the thickness of a silicon cluster thin film necessary to attain sufficient absorption from the sunlight spectrum is about 1 μm.

This indicates that there is high potential for a film-thickness reduction technique for a solar battery having a silicon cluster thin film as a quantum dot layer. Note that, while the silicon cluster thin film in the data from the Université Claude Bernard Lyon has an average particle diameter of 2 nm to 3 nm, no intermediate level is formed. In other words, the broken line indicated at a wavelength of 1100 nm shown in FIG. 6 is the absorption edge of the crystalline silicon, i.e., a wavelength corresponding to a band gap of $V_b=1.17$ eV; meanwhile, the absorption edge of the absorption coefficient data from the Université Claude Bernard Lyon is Vg=1.56 eV due to a quantum confinement effect, which shows the widening of the band gap. However, the absorption coefficient abruptly drops near the absorption edge, and thus this shows that the formation of a new intermediate energy level in a forbidden gap, which is a primary objective of a quantum dot solar battery, does not occur. In the present invention, the intermediate energy levels are realized by forming a cluster film having periodicity for the cluster array. Namely, the silicon cluster produced in the spatiotemporal confinement cluster source collides, for deposition, with the surface of the substrate, with kinetic energy about one order higher than that of the cluster produced by the conventional laser ablation. Different from atoms or molecules, a cluster composed of a large number of atoms has a large number of internal degrees of freedom, and thus the greater part of the kinetic energy of the cluster remains in the cluster as internal energy (lattice vibration of the cluster) without transferring to the substrate in the collision processes. The face-to-face distance between the μ-Si$_N$ clusters are close to each other with the progress of evaporation, and then the μ-Si$_N$ clusters take on an arrangement on the substrate that forms a more stable structure with high symmetry. When one cluster collides with the substrate at high energy, the resulting internal energy of the cluster in the collision process is transferred to its adjacent clusters, the transfer of which resultantly progresses the rearrangement.

A speed at which the clusters are rearranged is determined by a ratio of a collision frequency between adjacent clusters on the substrate (when the clusters made a lattice shape, its lattice vibration frequency) to an internal cluster temperature corresponding to the energy necessary for the rearrangement. Meanwhile, a speed at which the clusters are arranged in a disorderly fashion is determined by the frequency at which the clusters collide in a disorderly fashion with the substrate. On the substrate, a process occurs in which ordering due to the rearrangement of clusters competes with the disordering due to collision with the substrate. When the speed rearrangement of clusters is higher than that of disorder rearrangement, formation of the ordering of the arrangement (periodic structure) of clusters progresses. Thus, with the silicon cluster technology according to the present embodiment, where a cluster's incident energy on the substrate surface is set high, there is a high possibility of the silicon clusters being arranged with periodicity.

Figure 7:
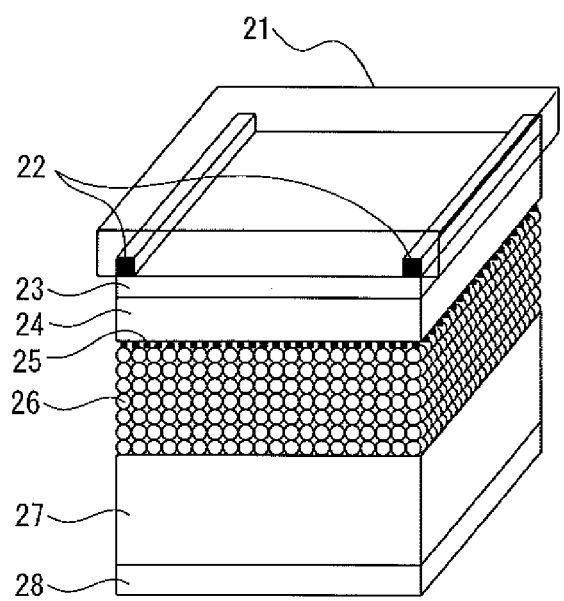
FIG. 7 is a view showing a device structure of a silicon cluster solar battery according to a second embodiment of the present invention.

The second embodiment according to the present invention is an embodiment in which a passivation film is further provided to the first embodiment. The second embodiment will be explained referring to FIG. 7. FIG. 7 shows a device structure according to the second embodiment. As shown in FIG. 7, the device according to the second embodiment includes a glass substrate 21; a lead-out electrode 22; a transparent electrode 23; a P-type microcrystalline silicon 24; a passivation film 25; quantum dots 26 consisting of silicon clusters (μ-Si$_N$); N-type amorphous silicon or N-type microcrystalline silicon 27, and an electrode 28. Typically, as a device structure according to the second embodiment, the Ag lead-out electrode 22 is firstly embedded in the glass substrate 21 such that a surface of the electrode is exposed, and the transparent electrode 23 made of ITO, etc., is deposited thereon. Then, the P-type microcrystalline silicon (p-Si, thickness of 10 nm) 24, the passivation film (graphene single layer) 25, the quantum dots (100 layers to 300 layers) 26 of the silicon clusters (μ-Si$_N$) made to have a particle diameter of 1 nm to 3 nm, and the N-type amorphous silicon (a-Si) or N-type microcrystalline silicon (p-Si) 27 (thickness of 1 μm) are stacked thereon. Thereafter, the Al back electrode (earthed electrode) 28 is finally deposited thereon.

As with aforesaid technical problem 5, one important factor for determining efficiency of a silicon cluster solar battery is carrier lifetime. A quantum dot solar battery has a problem in that the carrier lifetime shortens due to carriers captured at the interface between quantum dots having a large surface area. Therefore, it is necessary to control the interface in the quantum dot layer so as to extend the carrier life. It has been pointed out above, that in the P—Si$_N$—N junction utilizing μ-Si$_N$ clusters, the cage structure peculiar to the μ-Si$_N$ cluster locally exists in the surface layer part thereof. This cage structure has π electrons and forms sp$^2$ hybrid orbital, thereby exhibiting, as with graphite, an electron structure state excellent in conductivity. It has been stated that, because no unpaired electron exists on the surface of a silicon cluster, thereby leading to carrier conductivity, the carrier lifetime can be expected to be longer by several orders than the carrier lifetime on the surface of the silicon single crystal.

For control of the interface between the μ-Si$_N$ cluster layer and the P layer and N layer, the use of a graphene layer comprised of a stack of 1 to 5 carbon atom layers and which has superiority as a passivation thin film, can be considered. Graphene is a thin film that is artificially formed by isolating one or several atomic layers from graphite, which is known to have a crystal structure comprised of a stack of atomic layers, each of which has a structure in which carbon atoms are arranged to occupy the apexes of a regular hexagon. While graphene typically has a very thin thickness corresponding to one to several atomic layers, it is possible for grapheme to have a large thickness, extending over 100 μm. Electrons in graphene show behavior of relativistic particles, and achieve a high degree of mobility not dependent on temperature.

A graphene quantum dot (GQD) forming a quantum confinement state against electrons behaving as relativistic particles is anticipated as a nano-electronics material having both a high degree of carrier mobility and quantum state controllability. In graphene, electrons form, in the vicinity of a C nucleus, a continuous energy band free from a band gap and migrate freely in a solid. As electrons move away from the atomic nucleus, the electron energy band becomes gradually discrete. However, because the energy dispersion width and the distance from the atomic nucleus are linear, an electron travels at a speed described in relativistic quantum mechanics, i.e., at a speed close to the speed of light c* (c*=c$_0$/300, where c$_0$ is the speed of light in a vacuum). Therefore, the mass of the electrons becomes close to 0 (m*=0, m* is effective mass). In the 1.9 GeV synchrotron radiation ring (Advanced light Source) facility at Lawrence Berkeley National Laboratory in 2007, the electronic state of grapheme described in relativistic quantum mechanics was demonstrated.

Herein, the interaction between graphene and a μ-Si$_N$ cluster will be considered. A computer simulation has revealed that: an overlap of electron wave function between a π electron in the surface of the graphene and a π electron in the surface layer part of a μ-Si$_N$ cluster is observed; and electrons in graphene migrate to the μ-Si$_N$ cluster. The result of the computer simulation indicates that, when the μ-Si$_N$ cluster is absorbed on the surface of graphene, at a local area of the graphene that contacts the cluster, electrons in the graphene migrate into the μ-Si$_N$ cluster, where a local quantum confinement state is generated. As for an absorption position of the μ-Si$_N$ cluster on the graphene surface, it is found that a Si atom absorbed on the C nucleus, i.e., at positions K, K', shows stability. FIG. 8 shows an energy dispersion relation of graphene. The left part of FIG. 8 shows the reciprocal lattice of a graphene crystal structure, and the right part of FIG. 8 shows the relation (dispersion relation) between the electron wave number and the energy corresponding to the reciprocal lattice. By defining the absorption positions of the μ-Si$_N$ clusters on the graphene surface, it can be expected that the μ-Si$_N$ clusters on the graphene surface are arranged with a high degree of symmetry and with high-precision periodicity at atomic level.

The second embodiment shows an example where a P—Si$_N$—N junction utilizing graphene, as a promising passivation material for the junction interface of a silicon cluster solar battery, is included in a device design.

The production method of a silicon cluster solar battery according to the second embodiment will be explained below.

The steps of the second embodiment are the same as those of the first embodiment except that a passivation-film (graphene) deposition step is provided between the step (step 3) of depositing the P-type microcrystalline silicon and the step (step 4) of forming silicon clusters, which are the steps according to the first embodiment.

The passivation film (graphene) is formed by: producing a dispersion solution in which graphene refined from graphite by way of chemexfoliation is dispersed in methanol or in anhydrous propanol; and dropping the graphene dispersion solution on the substrate surface on which the P-type microcrystalline silicon has been deposited (step 3) in an Ar atmosphere. It is necessary that the concentration of the graphene dispersion solution is adjusted such that a single-layer graphene thin film is formed after the evaporation of a solvent of the dispersion solution.

After the single-layer graphene film 25 is stacked on the stacked P-type microcrystalline silicon 24, the $\mu$-Si$_N$ clusters 26 are deposited thereon. The $\mu$-Si$_N$ clusters flying with an energy of 1 eV or more per Si atom migrate onto the surface of the graphene, and adhere to stable positions at which Si atoms of the clusters are absorbed at the positions K,K' on the surface of the graphene. After the $\mu$-Si$_N$ clusters are periodically arranged with high precision, a single layer of $\mu$-Si$_N$ clusters is formed on the surface of the graphene 25. Subsequently, along the periodic array of the single layer of $\mu$-Si$_N$ clusters, the second and following layers of $\mu$-Si$_N$ clusters similarly form high-precision periodic arrays. In the $\mu$-Si$_N$ cluster layer comprising a stack of 300 or less layers, stable intermediate energy levels are formed due to the periodically arranged $\mu$-Si$_N$ clusters with high precision, which makes it possible to fabricate a highly-efficient silicon cluster solar battery. Further, carriers generated in the $\mu$-Si$_N$ cluster layer 26 are transferred, with a longer lifetime, to the valence band of the P-type layer 24 without disappearing due to the graphene single layer 25 inserted at the interface between the $\mu$-Si$_N$ cluster layer 26 and the P-type layer 24. In other words, after the carriers generated inside the $\mu$-Si$_N$ cluster layer 26 reach the surface layer part of the $\mu$-Si$_N$ clusters, the carrier-particle wave functions overlap between such $\mu$-Si$_N$ clusters and the graphene single layer 25 inserted at the interface between the $\mu$-Si$_N$ cluster layer 26 and the P-type layer 24, and the carriers thus smoothly migrate to the graphene. On the surface of the graphene, the carriers are brought into an extremely high conductive state, as described in relativistic quantum mechanics, and then smoothly migrate to the valence band of the P-type layer 24. Because the carriers generated in the $\mu$-Si$_N$ cluster layer have longer lifetime, it becomes possible to fabricate a silicon cluster solar battery having high conversion efficiency.

The examples given in the aforesaid embodiments are described only with the intention of causing the easy understanding of the present invention, and it is clear and obvious that the present invention is not limited to the foregoing embodiments.

The invention claimed is:

1. A solar battery comprising:
a P-type silicon layer;
a graphene layer formed on the P-type silicon layer;
a quantum dot layer formed on the graphene layer and having a multiple energy level structure consisting of an energy level of a valence band and an energy level of a conduction band, and intermediate energy levels located between the valence band and the conduction band; and
an N-type silicon layer formed on the quantum dot layer,
wherein the quantum dot layer is composed of a plurality of quantum dots, each quantum dot comprising a silicon cluster which has a first crystal structure at a surface thereof and a second crystal structure inside the cluster wherein the first crystal structure is different from the second crystal structure, the first crystal structure including a $\pi$ electron and forming an sp$^2$ hybrid orbital and the second crystal structure being a structure in which silicon atoms are periodically arranged; each quantum dot having a particle diameter of from 1 nm to 3 nm wherein along the particle diameter, a crystal structure of the quantum dot changes from the first crystal structure to the second crystal structure to the first crystal structure; wherein the plurality of quantum dots are periodically arranged so that a distance between adjacent quantum dots is 1 nm or less, wherein at the distance, wave functions of the adjacent quantum dots overlap each other; wherein an electron of the quantum dot layer directly migrates along the multiple energy level structure formed by periodic potentials of the plurality of quantum dots.

2. The solar battery according to claim 1, wherein the quantum dot layer comprises a stack of up to 300 layers of the plurality of quantum dots and has a thickness of 1 $\mu$m or less.

* * * * *